United States Patent
Mauder et al.

(10) Patent No.: US 8,269,270 B2
(45) Date of Patent: Sep. 18, 2012

(54) POWER SEMICONDUCTOR COMPONENT HAVING A GENTLE TURN-OFF BEHAVIOR

(75) Inventors: Anton Mauder, Kolbermoor (DE); Hans-Joachim Schulze, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 1088 days.

(21) Appl. No.: 11/016,963

(22) Filed: Dec. 20, 2004

(65) Prior Publication Data
US 2005/0133857 A1    Jun. 23, 2005

(30) Foreign Application Priority Data
Dec. 22, 2003  (DE) .................................. 103 60 574

(51) Int. Cl.
*H01L 29/76*   (2006.01)
(52) U.S. Cl. ........ 257/327; 257/328; 257/329; 257/492; 257/493; 257/498; 257/504
(58) Field of Classification Search .................. 257/487, 257/327, 328, 329, 492, 493, 498, 504
See application file for complete search history.

(56) References Cited

U.S. PATENT DOCUMENTS 3,909,119 A * 9/1975 Wolley ........................... 257/487
4,985,741 A   1/1991 Bauer et al.

FOREIGN PATENT DOCUMENTS

DE    10019813 A1    12/2001
DE    10240107 A1     3/2004

OTHER PUBLICATIONS

Baliga, B. Jayant, "Power Semiconductor Devices," PWS Publishing Company, pp. 81-122, (1996).

* cited by examiner

*Primary Examiner* — Thanh V Pham
(74) *Attorney, Agent, or Firm* — Dicke, Billig & Czaja, PLLC

(57) ABSTRACT

A vertical semiconductor component having a semiconductor body, which has an inner region and an edge region that is arranged between the inner region and an edge of the semiconductor body. At least one semiconductor junction between a first semiconductor zone of a first conduction type, said first semiconductor zone being arranged in the region of a first side of the semiconductor body in the inner region, and a second semiconductor zone of the second conduction type, said second semiconductor zone adjoining the first semiconductor zone in the vertical direction. A contiguous third semiconductor zone of the second conduction type, said third semiconductor zone being arranged at a distance from the first semiconductor zone in the second semiconductor zone in the vertical direction of the semiconductor body and extending as far as the edge region in the lateral direction of the semiconductor body, and the doping of the third semiconductor zone being selected in such a manner that it is completely depleted of charge carriers when a reverse voltage is applied to the pn junction.

21 Claims, 2 Drawing Sheets

POWER SEMICONDUCTOR COMPONENT HAVING A GENTLE TURN-OFF BEHAVIOR

CROSS-REFERENCE TO RELATED APPLICATIONS

This Utility Patent Application claims priority to German Patent Application No. DE 103 60 574.6-33, filed on Dec. 22, 2003, which is incorporated herein by reference.

FIELD OF THE INVENTION

The present invention relates to a semiconductor.

BACKGROUND

A component having a semiconductor body in the at least one semiconductor junction between a first semiconductor zone of a first conduction type, the first semiconductor zone being arranged in an inner region in the region of a first side of the semiconductor body, and a second semiconductor zone, which adjoins the first semiconductor zone in the vertical direction, is described, for example, in DE 100 19 813 C2. In the case of this component, a third semiconductor zone that is doped more heavily than the second semiconductor zone is formed in the second semiconductor zone such that it adjoins the first semiconductor zone. When a voltage that reverse-biases the pn junction is applied, the third semiconductor zone is intended to rapidly reduce the electric field strength in the region of the pn junction and, overall, contributes to reducing the voltage endurance of the component in the inner region in order to shift the location of a possible voltage breakdown from the edge region—which has a lower voltage endurance than the inner region—into the inner region.

EP 405 200 A1 describes a semiconductor component that is in the form of an IGBT and has a pn junction that is formed between a p-doped collector zone and an n-doped base zone. Arranged in the base zone of this component is a heavily n-doped recombination zone, which is itself so highly doped that it prevents a punch-through of the space charge zone and which has cutouts in which a punch-through of the space charge zone is possible.

Problems in semiconductor power components may result from an excessively rapid (hard) transition from the conducting state to the blocking state, as is explained briefly below.

In power components, the second semiconductor zone is doped more weakly than the first semiconductor zone and is essentially used to receive an applied reverse voltage when the semiconductor junction between the first and second semiconductor zones is blocked.

In the case of a forward-biased semiconductor junction, this second semiconductor zone is flooded with charge carriers. If this initially forward-biased semiconductor junction is subsequently reverse-biased, a current initially continues to flow, on account of the charge carriers present in the second semiconductor zone, until these charge carriers have been dissipated from the second semiconductor zone.

The change in current over time (di/dt) when turning off the component leads to induced voltages across parasitic inductances (for example in leads) which are inevitably present and increase as di/dt rises. In order to limit these voltages, it is desirable, when turning off the component, to avoid "current chopping" with an extremely large change in current over time and the associated high voltages across parasitic inductances.

SUMMARY

The invention provides a semiconductor component configured to have a limited current gradient during turn-off.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
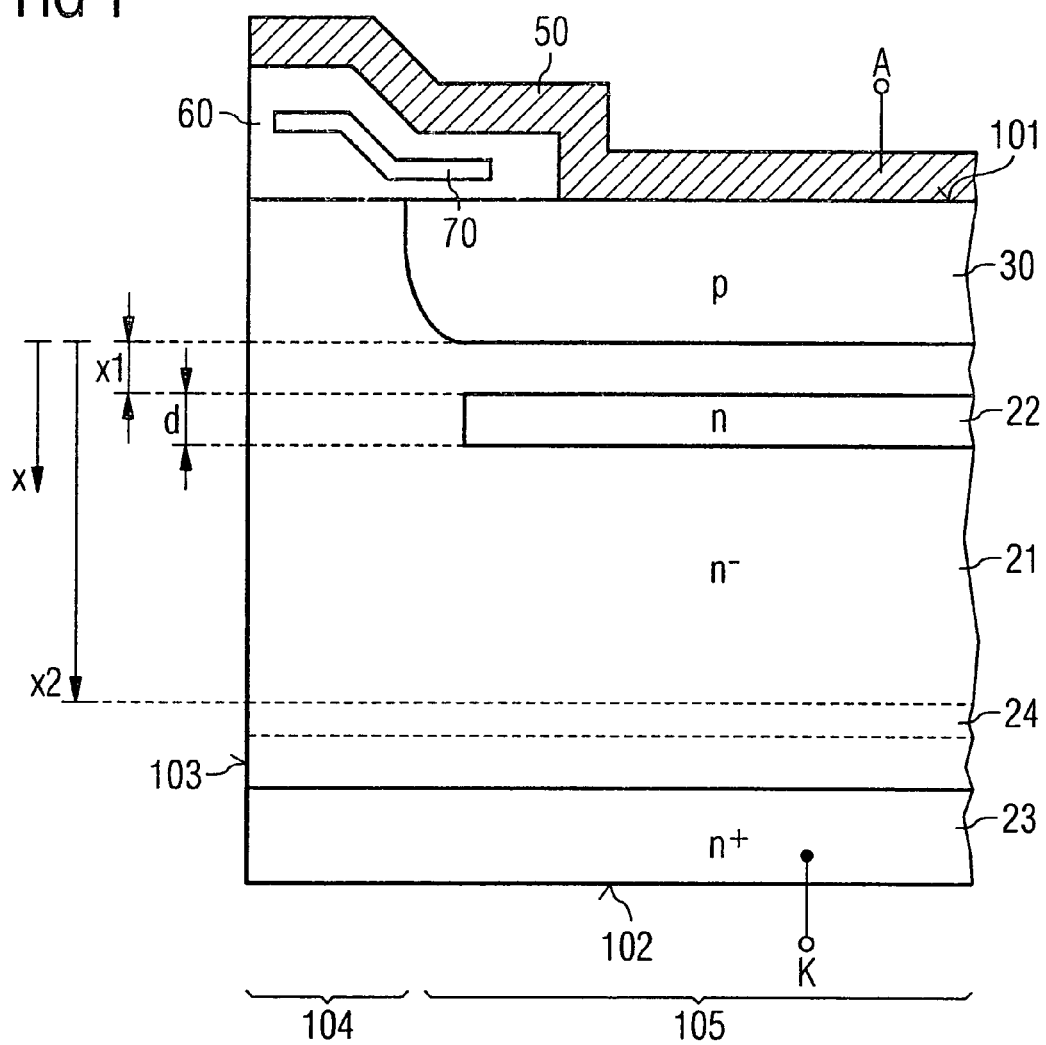
FIG. 1 illustrates a side view, in cross section, of a semiconductor component according to one embodiment of the invention in the form of a diode.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor component having a gentle turn-off behavior, that is to say a limited current gradient during turn-off.

In one embodiment, the component is in the form of a vertical semiconductor component and comprises a semiconductor body, which has an inner region and an edge region that is arranged between the inner region and an edge of the semiconductor body, and also at least one semiconductor junction between a first semiconductor zone of a first conduction type, the first semiconductor zone being arranged in the region of a first side of the semiconductor body in the inner region, and a second semiconductor zone that adjoins the first semiconductor zone in the vertical direction. In addition, the component comprises a contiguous third semiconductor zone of the second conduction type, the third semiconductor zone being arranged at a distance from the first semiconductor zone in the second semiconductor zone in the vertical direction of the semiconductor body and extending as far as the edge region in the lateral direction of the semiconductor body. In this case, the doping of the third semiconductor zone is selected in such a manner that it is completely depleted of charge carriers when a reverse voltage is applied to the pn junction.

The dimensions of the third semiconductor zone in the vertical direction of the semiconductor body are preferably considerably smaller than a thickness of the semiconductor body or the dimensions of the second semiconductor zone in the vertical direction.

In one embodiment, the third semiconductor zone, doped more highly than the second semiconductor zone, reduces the voltage endurance of the component in the inner region in comparison with a component without such a third semiconductor zone in the inner region. The doping of the third semiconductor zone, and thus the lowering of the voltage endurance in the inner region, are preferably matched to the voltage endurance in the edge region of the component in such a manner that the voltage endurance in the inner region is just below the voltage endurance in the edge region. As a result, the component breaks down when the maximum reverse voltage is reached in the inner region. As a result, the breakdown occurs over a cross-sectional area that is usually considerably larger than in the case of a breakdown in the edge region. The breakdown current is distributed over a larger cross-sectional area, thus resulting in a greater current-carrying capacity in the event of a breakdown. In this case, the voltage endurance (which is determined by the respectively lower voltage endurance of the voltage endurances in the inner region and edge region) of the component is not influenced, or is influenced only to an insignificant extent, by the third semiconductor zone.

Moreover, arranging the third semiconductor zone at a distance from the first semiconductor zone gives rise to a gentle turn-off behavior during a transition of the component from the conducting state to the blocking state. The gradient of the slope of a current that flows through the component during the transition from the conducting state to the blocking state becomes smaller as the distance between the third semiconductor zone and the first semiconductor zone increases, that is to say the turn-off behavior becomes more gentle as the distance increases. However, the desired reduction in the voltage endurance decreases as the distance between the third semiconductor zone and the first semiconductor zone increases. The distance between the third semiconductor zone and the first side in the vertical direction of the semiconductor body is ideally between 10% and 50% of the thickness or dimensions in the vertical direction of the second semiconductor zone.

The third semiconductor zone does not extend into the edge region in the lateral direction of the semiconductor body since it would otherwise lead to a further, in this case undesirable, lowering of the blocking capability in the edge region. The third semiconductor zone ends in the lateral direction, for example, within a metal contact that contact-connects the first semiconductor zone. In addition to lowering the reverse voltage in the inner region of the component, the third semiconductor zone, which is doped more heavily than the second semiconductor zone, furthermore has the effect of reducing the penetration depth of the electric field, starting from the pn junction, into the second semiconductor zone in comparison with a component without such a third semiconductor zone when a given voltage is applied.

The dimensions of the second semiconductor zone in the vertical direction of the component, which dimensions must be such that the electric field ends within the second semiconductor zone when an operating voltage is applied, may be reduced thereby, this having a positive effect on the on resistance in the conducting state of the component and a positive effect on its turn-off losses.

In addition, it is also possible to provide a field stop zone at a distance from the third semiconductor zone in the second semiconductor zone, said field stop zone being of the same conduction type as the second semiconductor zone and being so heavily doped that the electric field does not extend beyond the field stop zone when a reverse voltage is applied. The dimensions of the second semiconductor zone may be reduced further by providing such a field stop zone.

The doping of the third semiconductor zone is preferably selected in such a manner that a reduction in the voltage endurance in the inner region, caused by the third semiconductor zone, is between 10% and 20% of the voltage endurance that would exist without such a third semiconductor zone.

The third semiconductor zone that is arranged at a distance from the first side is, for example, n-doped. In this case, the doping may be formed by hydrogen-induced donors. In order to generate such hydrogen-induced donors, the component is irradiated with protons, in an adequately known manner, starting from one of the sides and is subsequently subjected to a thermal step. The distance between such a third semiconductor zone (formed by hydrogen-induced donors) and the irradiated side may be set using the irradiation energy of the protons.

The concept according to the invention of providing a third semiconductor zone (which is doped more heavily than the second semiconductor zone) at a distance from the pn junction in the second semiconductor zone can be applied to any desired vertical semiconductor components having a pn junction, in particular pn diodes, field effect transistors or IGBTs.

In the case of diodes, the first semiconductor zone forms the anode zone, for example, and the second semiconductor zone forms the base zone, of the component, a more heavily doped cathode zone adjoining said base zone.

The first semiconductor zone forms the body zone in the case of a field effect transistor and the base zone in the case of an IGBT, whereas the second semiconductor zone forms the drift zone in the case of a MOSFET and the base zone in the case of an IGBT. In the case of a MOSFET, the drift zone is adjoined by a drain zone, which is of the same conduction type as the drift zone but is doped more heavily, and, in the case of an IGBT, the base zone is adjoined by a collector zone, which is doped complementarily to the base zone. In addition, the body zone/base zone contains a complementarily doped terminal zone, which forms the emitter zone in the case of an IGBT and the source zone in the case of a MOSFET, and also a drive electrode, which is arranged in such a manner that it is insulated from the semiconductor body.

FIG. 1 illustrates a side view, in cross section, of a semiconductor component according to one embodiment of the invention, which is in the form of a diode and comprises a semiconductor body 100 having an inner region 105 and an edge region 104 that is arranged between the inner region 105 and an edge 103. In the inner region 105, a pn junction is formed between a first semiconductor zone 30 and a second semiconductor zone 21 that adjoins the first semiconductor zone 30 in the vertical direction. The first semiconductor zone 30 is arranged in the region of a front side 101 and is in the form of a well in the example.

In the exemplary embodiment, the first semiconductor zone 30 is p-doped and forms the emitter zone or anode zone of the diode. The second semiconductor zone 21 is complementary to the anode zone 30 and is thus n-doped. The second semiconductor zone 21 forms the base zone of the pn diode, a fourth semiconductor zone 23, which forms the cathode zone of the diode and is doped more heavily than the base zone, adjoining said base zone on a side remote from the anode zone 30.

A third semiconductor zone 22, which is of the same conduction type as the second semiconductor zone 21 but is doped more heavily than this second semiconductor zone 21, is provided in the second semiconductor zone 21 at a distance from the first semiconductor zone 30 and thus at a distance from the pn junction between the first semiconductor zone 30 and the second semiconductor zone 21. The third semiconductor zone 22 is in the form of a continuous zone in the lateral direction of the semiconductor body 100, that is to say in a direction parallel to the front side 101 or a rear side 102, and extends, in the inner region 105, as far as the edge region 104 but not as far as the edge 103. The doping of this third semiconductor zone 22 is selected in such a manner that it can be completely depleted of charge carriers when a reverse voltage is applied to the pn junction, which is synonymous with the fact that an electric field that propagates from the pn junction in the second semiconductor zone 21 when a reverse voltage is applied punches through the third semiconductor zone 22 as the reverse voltage increases.

In order to apply such a reverse voltage, the component comprises anode and cathode terminals A, K (illustrated diagrammatically), the anode terminal being formed by an electrically conductive layer 50, for example a metallization, which is applied to the front side 101 in the region of the anode zone 30.

It is adequately known, in the case of components having a pn junction in an inner region and having an edge region, that the voltage endurance in the edge region is lower than in the inner region or the bulk of the component on account of different effects. In order to increase the voltage endurance in the edge region, a wide variety of concepts such as, for example, introducing field rings into the semiconductor body in the edge region and/or applying field plates above the edge region are known. Edge terminations of this type for increasing the voltage endurance in the edge region are described, for example, in Baliga: "Power Semiconductor Devices", PWS Publishing, 1996, pages 81 to 122.

As representative of such edge termination concepts, FIG. 1 illustrates a field plate 70, which is arranged above the edge region in such a manner that it is insulated by an insulation layer 60.

Even in the case of well-dimensioned edge terminations, the voltage endurance in the edge region is only approximately 80% to 90% of the bulk blocking capability. In such components, the voltage endurance of the edge region thus limits the voltage endurance of the entire component. If, in the case of such a component, the reverse voltage rises to such an extent that the blocking capability of the edge region is reached, a voltage breakdown occurs in the edge region, while the voltage endurance has not yet been reached in the inner region. As a result, the avalanche current generated by the voltage breakdown is restricted to the edge region that is considerably smaller, in terms of area, than the inner region, which may lead to splitting of the current and thus to destruction of the component in the edge region.

The third semiconductor zone 22 of the semiconductor component according to the invention is doped in such a manner that it reduces the voltage endurance of the component in the inner region, the bulk blocking capability in the inner region 105 preferably being set, by means of the doping and the position of the third semiconductor zone 22 relative to the pn junction, in such a manner that it corresponds to the voltage endurance in the edge region 104 or is just below this voltage endurance in the edge region. This ensures that a voltage breakdown occurs in the inner region 104, which is considerably larger in terms of area, when a large reverse voltage is applied. It should be pointed out in this connection that the dimensions of the inner region 105 and of the edge region 104 are not illustrated to scale in the component shown in FIG. 1.

The effects of the third semiconductor zone 22 on the voltage endurance of the inner region are explained below with reference to FIG. 2.

Figure 2:
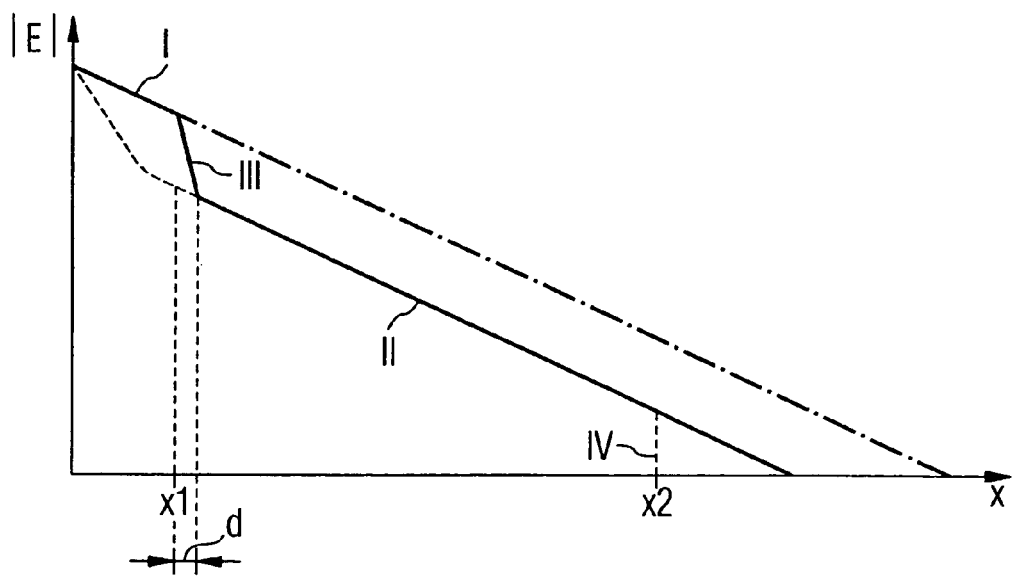
FIG. 2 illustrates a profile of the magnitude of the electric field strength in the vertical direction in the case of a component illustrated in FIG. 1 when a reverse voltage is applied.

FIG. 2 illustrates one embodiment of the magnitude of the electric field in the second semiconductor zone 21 in a direction x, starting from the pn junction between the first semiconductor zone 30 and the second semiconductor zone 21, for a predetermined reverse voltage. The magnitude of this electric field decreases, starting from the pn junction, as the distance x increases, the gradient of the decrease in the electric field being dependent on the doping of the second semiconductor zone 21 and of the third semiconductor zone 22. The solid line that is illustrated in FIG. 2 and represents the profile of the electric field for the component shown in FIG. 1 comprises two sections I, II which run more gently and the gradient of which is determined by the doping of the second semiconductor zone 21 and also a third section III, which runs more steeply and the gradient of which is determined by the doping in the third semiconductor zone 22.

If the breakdown voltage is selected in such a manner that the magnitude of the field strength at the pn junction corresponds to the critical field strength (Ecrit), the voltage endurance of the component results, in an adequately known manner, from the integral of the magnitude of the electric field strength or from the area under the curve of the magnitude of the electric field strength. In the case of the critical field strength, charge carriers within the free path length can absorb so much kinetic energy that it suffices to form further electron-hole pairs. The avalanche multiplication that starts as a result limits the maximum blocking capability of the component.

The dash-dotted curve illustrated in FIG. 2 shows the profile of the electric field strength for the inner region of a component without such a third semiconductor zone 22. In this case, the gradient of the profile of this electric field strength is exclusively dependent on the doping of the second semiconductor zone 21, with the result that, in contrast to the component according to the invention, there is no intermediate section that runs more steeply. Overall, the absence of the third semiconductor zone 22 results in a higher voltage endurance, which is immediately apparent from the larger area (in comparison with curve I, II, III) under the curve.

The curve profile that is depicted by dashed lines in FIG. 2 and merges into the section II of the curve profile of the component according to the invention shows the field strength profile in the case of a component in accordance with DE 100 198 13 C2 (already mentioned initially), in which a more heavily n-doped semiconductor zone directly adjoins the p-doped semiconductor zone of the pn junction. It is immediately apparent that the voltage endurance of the semiconductor component according to the invention, in which the more heavily doped semiconductor zone 22 is arranged at a distance from the pn junction, is greater than the voltage endurance of the component in accordance with the prior art explained.

Moreover, the more heavily doped third semiconductor zone 22 that is arranged at a distance from the pn junction gives rise to a gentle turn-off behavior of the component during the transition from the conducting state to the blocking state. The component shown in FIG. 1 conducts if a positive voltage is applied between the anode and the cathode terminal A, K and blocks if a negative voltage is applied between these terminals.

During the transition from the forward state to the reverse state, the flooding charge is removed from the component and an electric field is simultaneously built up in the depleted regions, starting from the front-side regions 30 and 31. As soon as the electric field reaches the third semiconductor zone 22, the rise in voltage—in conjunction with the simultaneously unchanged removal of the flooding charge from the deeper layers—can take place more rapidly. The electric field thus does not reach as far into the depth of the semiconductor when the same voltage is applied, with the result that flooding charge carriers are available for a longer time for the gentle switching behavior.

The higher the integral dopant dose of the third semiconductor zone 22 in the vertical direction, the more pronounced this behavior. However, the voltage endurance of the inner region falls to the same extent.

As explained, the component shown in FIG. 1 has a lower voltage endurance in the inner region than a component without such a third semiconductor zone 22. However, since the voltage endurance of the entire component is determined by the voltage endurance in the edge region, which is usually less than the bulk blocking capability, the provision of the third semiconductor zone 22 does not affect the voltage endurance of the entire component. Rather, this third semiconductor zone causes the voltage to break down in the inner region 105 of the component, as a result of which, in the event of a breakdown, higher breakdown currents can flow before the component is destroyed.

What is essential to the voltage endurance of the component illustrated in FIG. 1 is also that the electric field ends in the first semiconductor zone 21 when a reverse voltage is applied. Since, in the case of this component, with reference to FIG. 2, the electric field propagates (starting from the pn junction) to a lesser extent than in the case of a component without such a third semiconductor zone, it is possible, in the case of the component according to the invention, for the dimensions of the first semiconductor zone 21 to be smaller, this having a positive effect on the on resistance and the switching losses of the component.

The dimensions of the second semiconductor zone 21 may be reduced further by providing a field stop zone 24, which is doped more heavily than the second semiconductor zone 21 and is illustrated by dashed lines in FIG. 1. This field stop zone 24 is so highly doped that the electric field does not penetrate this highly doped field stop zone 24 when a reverse voltage is applied. IV is used in FIG. 2 to designate the profile of the electric field when such a field stop zone 24 is provided. In this case, the electric field ends in the region of the field stop zone 24, thus resulting in a slight reduction in the voltage endurance in comparison with a component without a field stop zone 24. Provided that such a further reduction in the voltage endurance can be accepted, the provision of the field stop zone 24 has the advantage that the dimensions of the first semiconductor zone 21 can be reduced further in the vertical direction of the component.

With reference to FIG. 1, the third semiconductor zone 22 may, for example, be realized by means of ion implantation, starting from the front side 101 of the semiconductor body. In this case, the distance between the third semiconductor zone 22 and the front side 101 may be set using the implantation energy.

Owing to its large penetration depth given a predetermined irradiation energy, hydrogen, in particular, is suited to producing an n-doped semiconductor zone 22. When the semiconductor body is irradiated with protons and subsequently thermally treated, so-called hydrogen-induced donors which have an n-doping effect are produced. These hydrogen-induced donors are activated by the thermal treatment, the thermal treatment also causing the protons to diffuse in the crystal lattice. The temperature budget of this thermal treatment is preferably in the lower permissible range in order to obtain as little diffusion as possible and thus a precisely delimited doped region for the third semiconductor zone 22. Typical temperature budgets for the thermal treatment are between 350° C. and 500° C. for time durations of between 10 min and 100 min.

The concept according to the invention of providing a buried semiconductor zone at a distance from a pn junction in one of the two semiconductor zones which form the pn junction, said buried semiconductor zone furthermore being doped more heavily than this semiconductor zone, can be applied to any desired semiconductor components having a pn junction.

Figure 3:
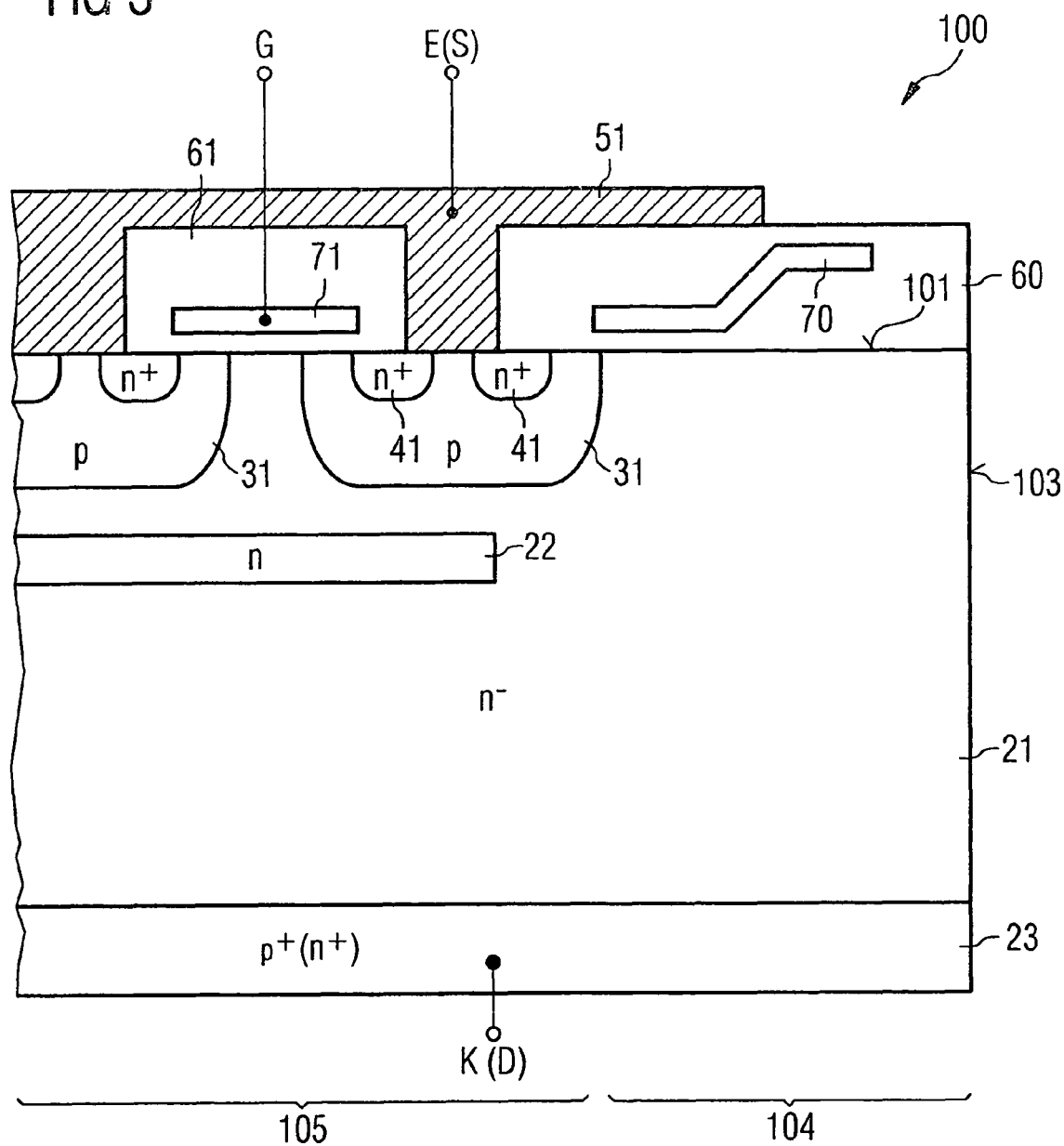
FIG. 3 partially illustrates, in cross section, a semiconductor component according to one embodiment of the invention in the form of a MOSFET or IGBT.

FIG. 3 partially shows a semiconductor component that is in the form of a field effect transistor and has such a more heavily doped third semiconductor zone (22).

The component comprises a semiconductor body 100, which has a front side 101 and a rear side 102 and has a plurality of first semiconductor zones 31 which are embedded in a complementarily doped semiconductor zone 21 in the region of the front side 101. These first semiconductor zones 31 are part of a cell array of the transistor and form the body zones of the latter, while the second semiconductor zone 21 forms the base zone in the case of an IGBT and the drift zone in the case of a MOSFET. Arranged in the body zones 31 are semiconductor zones 41 which are doped complementarily to the body zones 31 and, in the case of an IGBT, form the emitter zones of the latter and, in the case of a MOSFET, form the source zones of the latter. Gate electrodes 71 which are arranged in such a manner that they are adjacent to the body zones 31 and are insulated from the semiconductor body 100 by means of an insulation layer 61 are provided in order to drive the field effect transistor. The body zones 31 and the terminal zones 41 are short-circuited by means of a terminal electrode 51, which forms the emitter terminal E or source terminal S of the component.

Adjoining the base zone/drift zone 21 in the region of the rear side 102 of the component is a heavily doped semiconductor zone 23, which, in the case of an IGBT, is doped complementarily to the base zone/drift zone 21 and forms the collector zone and, in the case of a MOSFET, is of the same conduction type as the drift zone and forms the drain zone.

A third semiconductor zone 22, which is of the same conduction type as the base zone/drift zone 21 but is doped more heavily than the base zone/drift zone 21 is provided at a distance from the body zones 31 or at a distance from the cell array in the vertical direction.

In a manner that has already been explained, this third semiconductor zone 22 reduces the voltage endurance of the component in the inner region 105 when a reverse voltage is applied. The component shown in FIG. 3 is operated in the reverse direction if no drive potential is applied to the gate electrode and if a positive voltage is applied between the cathode or drain terminal K and the emitter or source terminal E, S. In this case, the profile of the electric field in the drift zone 21 corresponds to the profile illustrated in FIG. 2.

Irrespective of the concrete configuration of the component according to the invention, the reduction in the voltage endurance, caused by the third semiconductor zone 22, is preferably between 10% and 20% of the voltage endurance of a component without such a third semiconductor layer. It should be pointed out in this connection that the illustration in FIG. 2 that shows the electric field in the inner region is based on an ideal pn junction that propagates infinitely on all sides in the lateral direction, there thus being no need to take any edge effects into account in said illustration.

The distance between the third semiconductor zone 22 and the front side 101 in the vertical direction of the semiconductor body is preferably between 10% and 50% of the thickness of the entire semiconductor body 100.

Although the invention has been explained in connection with a diode component and a transistor component, it should be pointed out that the invention can be used in any desired components having a pn junction and having any desired cell and edge concepts.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A vertical semiconductor component comprising:
    a semiconductor body, having an inner region and an edge region that is arranged between the inner region and an edge of the semiconductor body;
    at least one semiconductor junction between a first semiconductor zone of a first conduction type, the first semiconductor zone being arranged in the region of a first side of the semiconductor body in the inner region, and a second semiconductor zone of the second conduction type, the second semiconductor zone adjoining the first semiconductor zone in the vertical direction, distinguished by
    a contiguous third semiconductor zone of the second conduction type, the third semiconductor zone being arranged at a distance from the first semiconductor zone in the second semiconductor zone in the vertical direction of the semiconductor body and extending as far as the edge region in the lateral direction of the semiconductor body, and the doping of the third semiconductor zone being selected in such a manner that it is completely depleted of charge carriers when a reverse voltage is applied to the pn junction; and
    wherein the doping of the third semiconductor zone is selected such that an electric field caused by the reverse voltage and which propagates from the pn junction in the second semiconductor zone punches through the third semiconductor zone as the reverse voltage increases.

2. The semiconductor component of claim 1, comprising wherein the doping of the third semiconductor zone is selected in such a manner that a reduction in the voltage endurance, caused by the third semiconductor zone, is between 10% and 20% of the voltage endurance without such a third semiconductor zone when a reverse voltage is applied to the pn junction.

3. The semiconductor component of claim 1, comprising the dimensions of the third semiconductor zone in the vertical direction of the semiconductor body are considerably smaller than a thickness of the semiconductor body in the vertical direction.

4. The semiconductor component of claim 1, comprising the distance between the third semiconductor zone and the first side in the vertical direction is between 10% and 50% of the thickness of the second semiconductor zone.

5. The semiconductor component of claim 1, comprising the third semiconductor zone ends in front of the edge in the lateral direction of the semiconductor body.

6. The semiconductor component of claim 1, comprising the third semiconductor zone is n-doped, the doping being formed by hydrogen-induced donors.

7. The semiconductor component of claim 1, comprising a fourth semiconductor zone of the second conduction type, the fourth semiconductor zone being doped more heavily than the second semiconductor zone and adjoining the second semiconductor zone.

8. The semiconductor component of claim 1, comprising a field stop zone of the second conduction type is arranged at a distance from the third semiconductor zone in the second semiconductor zone.

9. The semiconductor component of claim 1, wherein the component is configured as a transistor component, comprising:
    at least one terminal zone that is arranged in the first semiconductor zone and is doped complementarily to the first semiconductor zone;
    at least one drive electrode that is arranged in such a manner that it is insulated from the semiconductor body and is adjacent to the first semiconductor zone.

10. The semiconductor component of claim 9, comprising a fourth semiconductor zone of the first or second conduction type, the fourth semiconductor zone being doped more heavily than the second semiconductor zone and adjoining the second semiconductor zone.

11. The semiconductor component of claim 10, comprising a terminal electrode that contact-connects the first semiconductor zone.

12. A semiconductor component comprising:
    a semiconductor body, having an inner region and an edge region that is arranged between the inner region and an edge of the semiconductor body;
    at least one semiconductor junction between a first semiconductor zone of a first conduction type, the first semiconductor zone being arranged in the region of a first side of the semiconductor body in the inner region, and a second semiconductor zone of the second conduction type, the second semiconductor zone adjoining the first semiconductor zone in the vertical direction, distinguished by
    a contiguous third semiconductor zone of the second conduction type, the third semiconductor zone being arranged at a distance from the first semiconductor zone in the second semiconductor zone in the vertical direction of the semiconductor body and extending as far as the edge region in the lateral direction of the semiconductor body, and the doping of the third semiconductor zone being selected in such a manner that it is completely depleted of charge carriers when a reverse voltage is applied to the pn junction; and
    wherein the doping of the third semiconductor zone is selected in such a manner that a reduction in the voltage endurance, caused by the third semiconductor zone, is between 10% and 20% of the voltage endurance without such a third semiconductor zone when a reverse voltage is applied to the pn junction; and
    the dimensions of the third semiconductor zone in the vertical direction of the semiconductor body are considerably smaller than a thickness of the semiconductor body in the vertical direction;
    wherein the doping of the third semiconductor zone is selected such that an electric field caused by the reverse voltage and which propagates from the pn junction in the second semiconductor zone punches through the third semiconductor zone as the reverse voltage increases.

13. A semiconductor component comprising:
a semiconductor body, having an inner region and an edge region that is arranged between the inner region and an edge of the semiconductor body;
at least one semiconductor junction between a first semiconductor zone of a first conduction type, the first semiconductor zone being arranged in the region of a first side of the semiconductor body in the inner region, and a second semiconductor zone of the second conduction type, the second semiconductor zone adjoining the first semiconductor zone in the vertical direction, distinguished by
a contiguous third semiconductor zone of the second conduction type, the third semiconductor zone being arranged at a distance from the first semiconductor zone in the second semiconductor zone in the vertical direction of the semiconductor body and extending as far as the edge region in the lateral direction of the semiconductor body, and the doping of the third semiconductor zone being selected in such a manner that it is completely depleted of charge carriers when a reverse voltage is applied to the pn junction; and
the dimensions of the third semiconductor zone in the vertical direction of the semiconductor body are considerably smaller than a thickness of the semiconductor body in the vertical direction, and the distance between the third semiconductor zone and the first side in the vertical direction is between 10% and 50% of the thickness of the second semiconductor zone;
wherein the doping of the third semiconductor zone being selected in such a manner an electric field caused by the reverse voltage and which propagates from the pn junction in the second semiconductor zone punches through the third semiconductor zone as the reverse voltage increases.

14. The semiconductor component of claim 13, comprising the third semiconductor zone ends in front of the edge in the lateral direction of the semiconductor body.

15. The semiconductor component of claim 14, comprising the third semiconductor zone is n-doped, the doping being formed by hydrogen-induced donors.

16. The semiconductor component of claim 15, comprising a fourth semiconductor zone of the second conduction type, the fourth semiconductor zone being doped more heavily than the second semiconductor zone and adjoining the second semiconductor zone.

17. The semiconductor component of claim 16, comprising a field stop zone of the second conduction type is arranged at a distance from the third semiconductor zone in the second semiconductor zone.

18. The semiconductor component of claim 17, wherein the component is configured as a transistor component, comprising:
at least one terminal zone that is arranged in the first semiconductor zone and is doped complementarily to the first semiconductor zone;
at least one drive electrode that is arranged in such a manner that it is insulated from the semiconductor body and is adjacent to the first semiconductor zone.

19. A transistor semiconductor component comprising:
a semiconductor body, having an inner region and an edge region that is arranged between the inner region and an edge of the semiconductor body;
at least one semiconductor junction between a first semiconductor zone of a first conduction type, the first semiconductor zone being arranged in the region of a first side of the semiconductor body in the inner region, and a second semiconductor zone of the second conduction type, the second semiconductor zone adjoining the first semiconductor zone in the vertical direction, distinguished by
a contiguous third semiconductor zone of the second conduction type, the third semiconductor zone being arranged at a distance from the first semiconductor zone in the second semiconductor zone in the vertical direction of the semiconductor body and extending as far as the edge region in the lateral direction of the semiconductor body, and the doping of the third semiconductor zone being selected in such a manner that it is completely depleted of charge carriers when a reverse voltage is applied to the pn junction;
the dimensions of the third semiconductor zone in the vertical direction of the semiconductor body are considerably smaller than a thickness of the semiconductor body in the vertical direction;
at least one terminal zone that is arranged in the first semiconductor zone and is doped complementarily to the first semiconductor zone; and
at least one drive electrode that is arranged in such a manner that it is insulated from the semiconductor body and is adjacent to the first semiconductor zone; and
wherein the doping of the third semiconductor zone are selected such that an electric field caused by the reverse voltage and which propagates from the pn junction in the second semiconductor zone punches through the third semiconductor zone as the reverse voltage increases.

20. The semiconductor component of claim 19, comprising a fourth semiconductor zone of the first or second conduction type, the fourth semiconductor zone being doped more heavily than the second semiconductor zone and adjoining the second semiconductor zone.

21. A vertical semiconductor component comprising:
a semiconductor body, having an inner region and an edge region that is arranged between the inner region and an edge of the semiconductor body;
at least one semiconductor junction between a first semiconductor zone of a first conduction type, the first semiconductor zone being arranged in the region of a first side of the semiconductor body in the inner region, and a second semiconductor zone of the second conduction type, the second semiconductor zone adjoining the first semiconductor zone in the vertical direction, distinguished by
a contiguous third semiconductor zone of the second conduction type, including
means for arranging the third semiconductor zone a distance from the first semiconductor zone in the second semiconductor zone in the vertical direction of the semiconductor body and extending as far as the edge region in the lateral direction of the semiconductor body, and the doping of the third semiconductor zone being selected in such a manner that it is completely depleted of charge carriers when a reverse voltage is applied to the pn junction; and
wherein the doping of the third semiconductor zone is selected such that an electric field caused by the reverse voltage and which propagates from the pn junction in the second semiconductor zone punches through the third semiconductor zone as the reverse voltage increases.

* * * * *